United States Patent [19]

Hayes

[11] Patent Number: 5,329,233
[45] Date of Patent: Jul. 12, 1994

[54] CYLINDRICAL LOCAL COIL FOR NUCLEAR MAGNETIC RESONANCE IMAGING

[75] Inventor: Cecil E. Hayes, Seattle, Wash.

[73] Assignee: General Electric Company, Milwaukee, Wis.

[21] Appl. No.: 988,542

[22] Filed: Dec. 10, 1992

[51] Int. Cl.⁵ .............................................. G01V 3/00
[52] U.S. Cl. ...................................................... 324/318
[58] Field of Search ............... 324/300, 307, 309, 310, 324/311, 312, 313, 314, 318, 319, 320, 322; 128/653.5

[56] References Cited

U.S. PATENT DOCUMENTS

| | | | |
|---|---|---|---|
| 4,825,162 | 4/1989 | Roemer et al. | 324/318 |
| 4,879,516 | 11/1989 | Mehdizadeh et al. | 324/318 |
| 4,906,933 | 3/1990 | Keren | 324/318 |
| 5,030,915 | 7/1991 | Boskamp et al. | 324/318 |

Primary Examiner—Michael J. Tokar
Attorney, Agent, or Firm—Quarles & Brady

[57] ABSTRACT

A local coil for magnetic resonance imaging employs a cylindrical form supporting a coil array of one or more coil groups arranged circumferentially around the cylindrical form. Multiple coil groups are overlapped to provide electrical isolation between the coil groups preserving the signal to noise ratio inherent in a local coil while providing a greater field-of-view than may be obtained from such coil group.

12 Claims, 3 Drawing Sheets

CYLINDRICAL LOCAL COIL FOR NUCLEAR MAGNETIC RESONANCE IMAGING

BACKGROUND OF THE INVENTION

1. Field of the Invention

The field of the invention is magnetic resonance imaging (MRI) and, in particular, local coils for use in receiving MRI signals.

2. Background Art

A. Magnetic Resonance Imaging

In MRI, a uniform magnetic field $B_0$ is applied to an imaged object along the z-axis of a Cartesian coordinate system the origin of which is approximately centered within the imaged object. The effect of the magnetic field $B_0$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$\omega = \gamma B_0 \quad (1)$$

where $\omega$ is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore, in a 1.5 Tesla polarizing magnetic field $B_0$, the resonant or Larmor frequency of water is approximately 63.9 MHz.

In a typical imaging sequence for an axial slice, the RF excitation signal is centered at the Larmor frequency $\omega$ and applied to the imaged object at the same time as a magnetic field gradient $G_z$ is applied. The gradient field $G_z$ causes only the nuclei in a slice through the object along an x-y plane, to have the resonant frequency $\omega$ and to be excited into resonance.

After the excitation of the nuclei in this slice, magnetic field gradients are applied along the x and y axes. The gradient along the x axis, $G_x$, causes the nuclei to precess at different frequencies depending on their position along the x axis, that is, $G_x$ spatially encodes the precessing nuclei by frequency. The y axis gradient, $G_y$, is incremented through a series of values and encodes the y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview of NMR image reconstruction is contained in the book "Magnetic Resonance Imaging, Principles and Applications" by D.N. Kean and M.A. Smith.

B. Local Coils

The quality of the image produced by MRI techniques is dependent, in part, on the strength of the NMR signal received from the precessing nuclei. For this reason, it is known to use an independent RF receiving coil placed in close proximity to the region of interest of the imaged object to improve the strength of this received signal. Such coils are termed "local coils" or "surface coils". The smaller area of the local coil permits it to accurately focus on NMR signals from the region of interest. Further, the RF energy received by a local coil is obtained from a smaller volume giving rise to improved signal-to-noise ratio in the acquired NMR signal.

The improved signal-to-noise ratio of a local coil comes at the cost of a reduced field-of-view, that is, a reduced volume of the patient over which the coil is sufficiently sensitive to detect the NMR signal. This reduced field-of-view is a direct result of the smaller coil size of the local coil.

It is known to use multiple local coils to increase the field-of-view. In order to maintain a high signal-to-noise ratio in such multiple local coil constructions, it is critical that the electrical interaction between local coils be minimized—otherwise the multiple, local coils devolve to a single larger coil without the signal-to-noise advantages of the individual local coils.

U.S. Pat. No. 4,825,162, issued Apr. 25, 1989, (the "Roemer" patent) assigned to the same assignee as the present invention, and hereby incorporated by reference, describes a local coil array in which a plurality of single turn coils are arrayed over a surface (not necessarily a plane) so as to provide a large field-of-view and the signal-to-noise benefits of the individual local coils. Isolation between the loops of the coil array is maintained by adjusting the degree of overlap between the loops so that they are electromagnetically decoupled and by connecting each loop to an extremely low impedance preamplifier.

As described in the Roemer patent, the low impedance preamplifiers used with each coil effectively reduce the interaction of the individual coils by a factor of Q/N where Q is the quality factor of each coil and N is the ratio between the output capacitance of each coil and its net series capacitance.

Although the Roemer patent contemplates that its coil array may follow a three dimensional object by a "wrapping" of the array around that object, for small diameter objects, such as knees or portions of other extremities, this approach is not completely successful. If the radius of curvature of the wrapping is sufficiently small, the isolation between the individual coils breaks down, importantly, non-adjacent coils along the surface of the array may interact when they become opposed across the extremity. This interaction of opposed coils is stronger than that which may be nullified by the preamplifier decoupling mechanism described in the Roemer patent.

SUMMARY OF THE INVENTION

The present invention provides a local coil array for use with extremities such as the knee and foot where there may be strong interaction between non-adjacent coils in the array as a result of the sharp curvature of the array as it curves about the extremity.

In particular, the present invention employs cylindrical coil groups as the elemental part of an array. The cylindrical coil groups conform to the circumference of a cylindrical form, each to be sensitive to a small volume along the axis of the form. A cylindrical array is then constructed out of several of the overlapping cylindrical coil groups much as the planar array of Roemer is formed out of overlapping planar loops. The overlap between adjacent cylindrical coil groups is adjusted to eliminate the interaction between the cylindrical coil groups.

Thus, it is a first object of the invention to provide a high signal-to-noise ratio cylindrical array that may be employed in a cylindrical configuration for use in a knee coil, for example, and which may be expanded arbitrarily by the addition of elemental, cylindrical coil groups to provide an arbitrarily large field-of-view.

The elemental, cylindrical coil groups may be formed by two crossing Helmholtz pairs, generally being opposed loops electrically connected to be sensitive to a time varying uniform field passing diametrically through the cylinder. The coil loops of the Helmholtz pair are joined as one element, and hence the issue of isolation between the coils of each pair becomes moot. The signal from each Helmholtz pair is independently measured.

It is another object of the invention to provide subelemental coil, from which the elemental cylindrical coil group is constructed and which is isolated from other sub-element coils to provide improved signal-to-noise ratio. That sub-elemental coil is one Helmholtz pair. The symmetry of the coils in each Helmholtz pair isolates each Helmholtz pair from the others of that group regardless of the coil overlap about the circumference of the cylinder.

It is yet another object of the invention to provide an adaptable coil design for the elemental cylindrical coil group. The connection of the opposing coils as single Helmholtz coils allows the multiple coils of each cylindrical coil group to be overlapped arbitrarily. The axial segments of each coil, when the coils are generally rectangular, may be spaced evenly about the circumference of the cylindrical form to provide more uniform coverage of the enclosed volume.

Other objects and advantages besides those discussed above will be apparent to those skilled in the art from the description of the preferred embodiment of the invention which follows. Thus, in the description, reference is made to the accompanying drawings, which form a part hereof, and which illustrate one example of the invention. Such example, however, is not exhaustive of the various alternative forms of the invention. Therefore, reference should be made to the claims which follow the description for determining the full scope of the invention.

DETAILED DESCRIPTION OF THE PREFERRED EMBODIMENT

Figure 1:
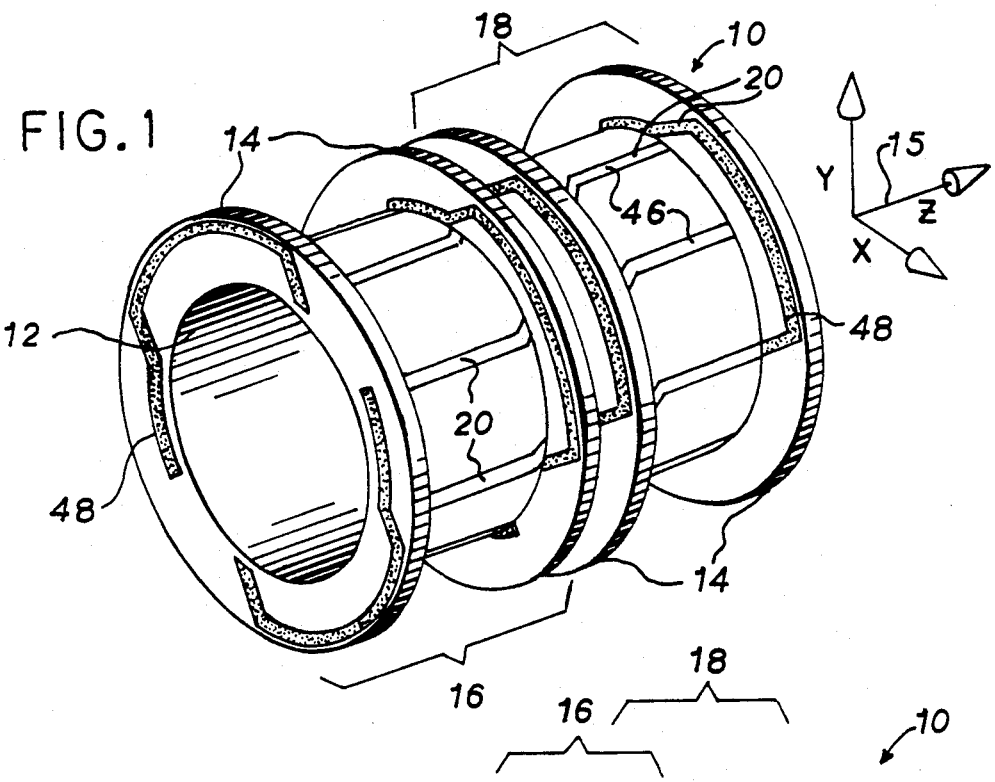
FIG. 1 is a perspective view of a local coil for a knee or the like constructed according to the present invention and including two overlapping cylindrical coil groups.

Referring to FIG. 1, a local coil 10 of the present invention includes a cylindrical form 12 of a diameter and length to accommodate and surround a patient's knee or elbow (not shown) with the patient's leg or arm extending along the longitudinal axis 15 of the cylindrical form 12. The longitudinal axis 15 defines a z-axis of a Cartesian coordinate system also having transverse, orthogonal x and y axes. The cylindrical form 12 is constructed of a rigid non-conductive material having a low dielectric constant, such as epoxy impregnated fiberglass.

Extending radially outward from the outer surface of the cylindrical form 12 are four annular ribs 14 which define the edges, along the longitudinal axis 15, of a first and second coil group 16 and 18. The coils of each coil group 16 and 18 are conductive patterns 20 of copper foil attached to the outer surface of the cylindrical form 12 and to the longitudinally exposed faces of the ribs 14 as will be described.

Figure 2:
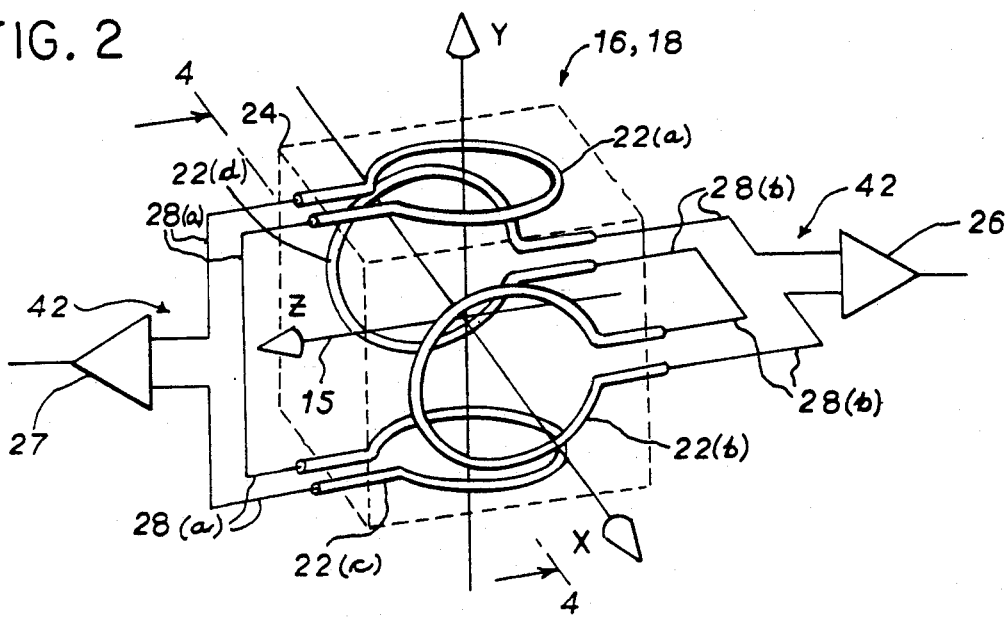
FIG. 2 is a schematic representation of quadrature opposed Helmholtz coils forming one cylindrical coil group in the preferred embodiment of the present invention.

Referring now to FIG. 2, the conductive patterns 20 of each coil group 16 and 18 are connected together to form four loops 22(a) through 22(d). Loops 22(a) and 22(c) are generally opposed about volume 24 within the cylindrical form 12 (shown in FIG. 1) and have a common transverse axis parallel to the y-axis of the Cartesian coordinate system. Likewise, loops 22(b) and 22(d) are opposed about the volume 24 and share a common axis parallel to the x-axis of the Cartesian coordinate.

Each pair of loops 22(a) and 22(c), and loops 22(b) and 22(d), form a Helmholtz pair and are connected in series be responsive to variations in a magnetic field along their respective axes. Specifically, for a varying magnetic field along the x-axis, a voltage is generated by loops 22(b) and 22(d) which are connected so that these voltages augment each other as received by a preamplifier 26. Conversely, a time varying magnetic field along the y-axis generates voltages in loops 22(a) and 22(c) which loops are connected so that these voltages add as received by the inputs of preamplifier 27.

Figure 3:
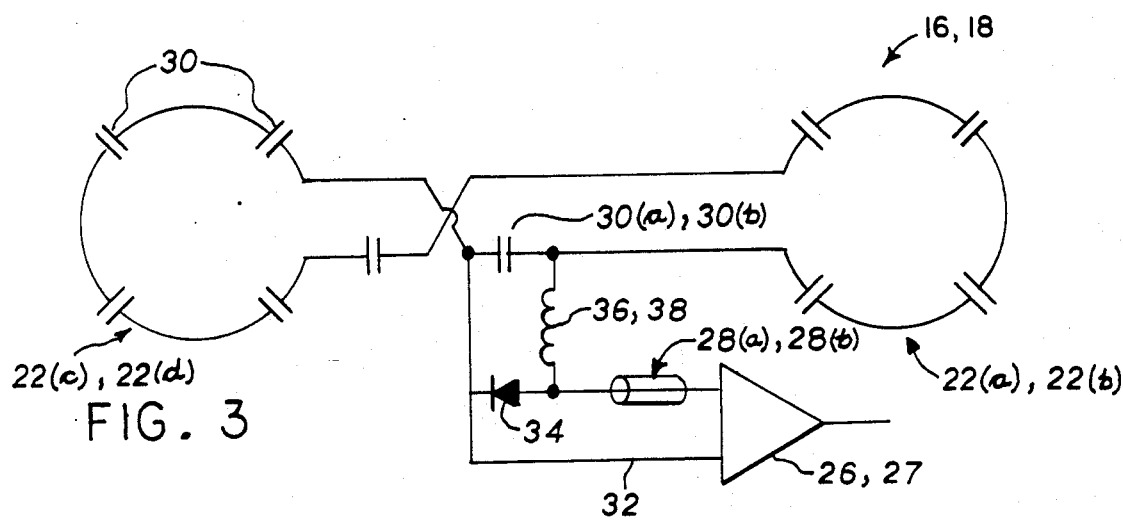
FIG. 3 is an electrical schematic showing the connection of opposing coil pairs of the Helmholtz coil to a low impedance preamplifier.

Referring to FIGS. 1, 2, and 3, each of the loops 22(a) through 22(d) includes a plurality of series connected capacitors 30 which together with the intrinsic inductance of the conductive patterns 20 of the loops 22(a) through 22(d) tune the loop to resonance at the Larmor frequency of the MRI system. The signal generated by each pair of loops 22(a) and 22(c), and 22(b) and 22(d) may be taken across one such capacitor 30(a) or 30(b) corresponding with the similarly lettered loops of the pair.

Coaxial cables 28(a)–(b) connect the signals generated across correspondingly lettered capacitors 30(a) through 30(b) with its respective preamplifier 27 or 26. One terminal of each of capacitors 30 for each of the opposed loops 22 of a given Helmholtz coil pair is connected to the shield 32 of the corresponding coaxial cable 28. The shield 32 is also connected to the cathode of a pin diode 34 and to one input of a preamplifier 26 or 27. A center conductor of the coaxial cable 28 connects to the other terminal of each of the capacitors 30 for the loops 22 of a Helmholtz pairs to the anode of the pin diode 34 and to the other input of the preamplifier 26 or 27.

Two equal inductances 36 and 38 are each associated with a Helmholtz pair. During the transmit pulse of the NMR system, it is desirable that the loops 22(a) through 22(d) be desensitized and this accomplished by adjusting the values of the inductances 36 and 38 so that they form a parallel resonant circuit with the associated capacitors 30 when pin diode 34 is conducting. This parallel resonance blocks the conduction of current through the loops 22 thus decoupling the loops 22 from the transmit pulse.

The conductance of the pin diode 34 is controlled by a DC current injected through auxiliary leads 40 across the pin diode 34 as is generally understood in the art. During the receiving portion of the MRI cycle, the DC current through leads 40 is deactivated and the parallel resonance of capacitors 30 and inductances 36 or 38 is broken allowing reception of the NMR signal.

The preamplifier 26 or 27 is a low impedance preamplifier and may be connected to coaxial cable 28(a) or 28(b) which is a multiple of ½ the wave length of the MRI signal at the Larmor frequency to preserve the low impedance of the preamplifier 26 or 27 at the terminals of the pin diode 34.

Figure 4:
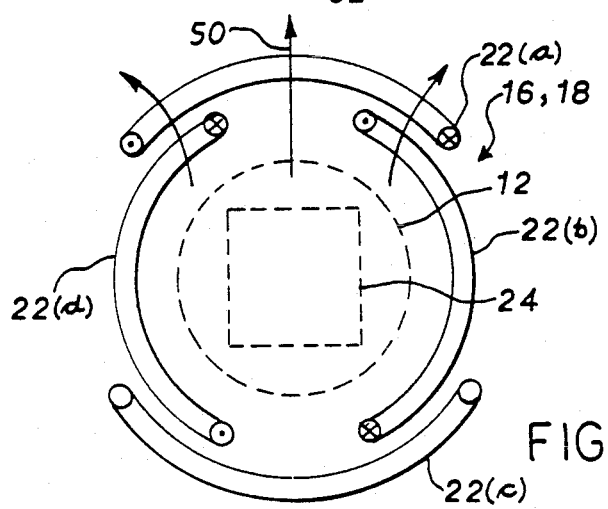
FIG. 4 is a schematic cross-section of the cylindrical coil group of FIG. 2 in the plane of the quadrature axes as those coils have been conformed to the circumference of a cylinder and illustrating the intrinsic isolation between Helmholtz pairs.

Referring now to FIGS. 2 and 4, the loops 22(a) through 22(d) of the present invention conform to the cylindrical form 12. The connection of opposing loops 22(a) and 22(c) or 22(b) and 22(d) as Helmholtz pairs electrically couples two coils of each pair. On the other hand, each pair is intrinsically isolated from the other pair as a result of this Helmholtz pair connection. For example, a magnetic field 50 generated by loops 22(a) is intercepted by overlapping portions of loops 22(d) and 22(b). Yet this magnetic field generates countervailing current in loops 22(d) and 22(b) which cancel when the signals from loops 22(d) and 22(b) are added together, as described above with respect to FIG. 2. Thus, generally, each loop 22 of a coil group 16 or 18 is electrically isolated from the adjacent coils (although not the opposing coil) within that coil group 16 or 18. This is true regardless of the overlap between the loops 22 of a coil group 16 or 18.

Figure 5:
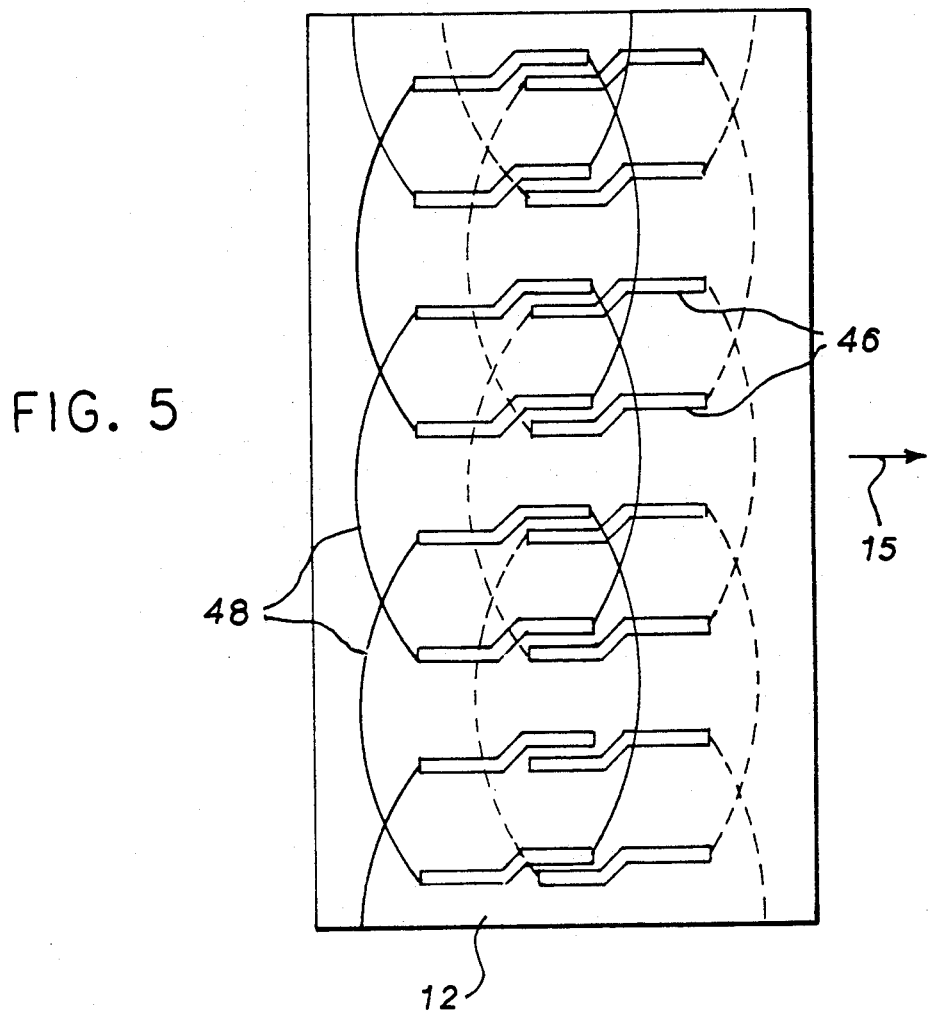
FIG. 5 is a plan view of the conductors on the surface of the cylinder of the coil of FIG. 1 as unrolled showing the interjoining of those conductors to create two overlapping cylindrical coil groups.

Referring to FIG. 5, the loops 22(a) through 22(d) are formed to be generally rectangular with longitudinal segments 46 and circumferential segments 48. The above described indifference of each coil group 16 or 18 to the circumferential overlap of its individual loops 22 allows the loops 22 to be overlapped arbitrarily so as to enhance the uniformity of the reception field of the cylindrical coil group 16 or 18. Specifically, the overlap, which is dictated by the spacing between the longitudinal segments 46, is adjusted so that the longitudinal segments 46 are evenly spaced around the circumference of the cylindrical form 12. In a four loop coil group 16 or 18, each longitudinal segment 46 is spaced at 45° about the circumference of the cylindrical form 12.

Figure 7A:
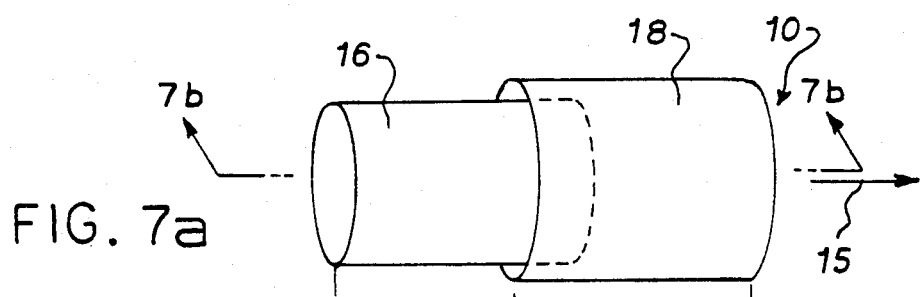
FIGS. 7a and 7b are a simplified representation of the overlapping coil groups showing the effect of the overlap in isolating each of the coil groups from the other.
Figure 7B:
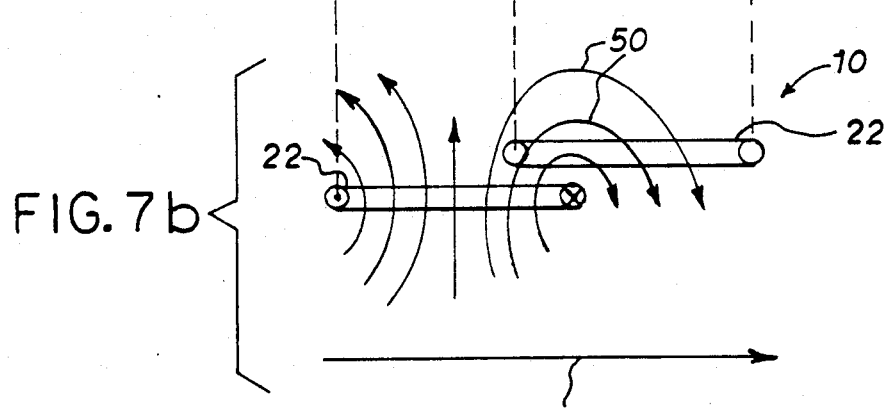

Referring to FIG. 7(a) and (b), ideally the longitudinal extent of each cylindrical coil group 16 and 18, as dictated generally by the length of the longitudinal segments 46, is short so as to preserve the high signal-to-noise ratio obtainable through a local coil. This, of course, results in a reduced longitudinal field-of-view and so in order to increase the field-of-view along the longitudinal axis 15, at least two overlapping coil groups 16 and 18 are employed. The overlap of the coil groups 16 and 18 along the longitudinal axis is controlled, as will be described, to reduce their inductive coupling.

Figure 6:
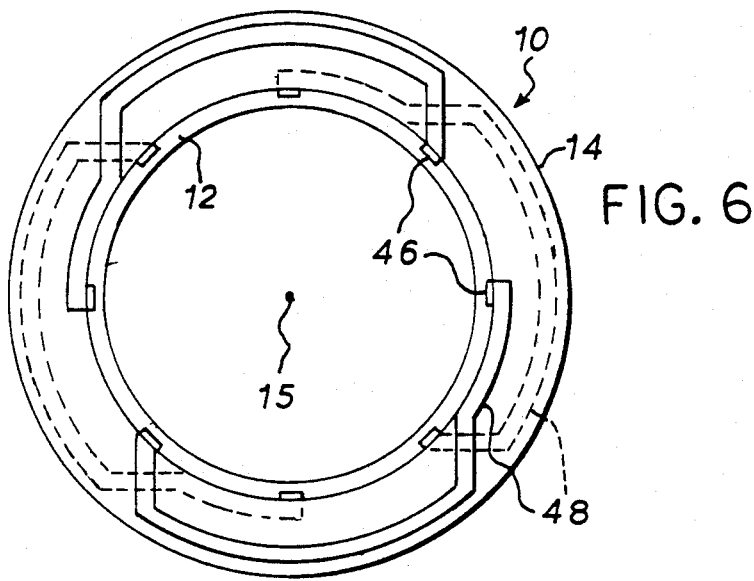
FIG. 6 is an elevation view of the circumferential ribs of FIG. 1 carrying circumferential conductors connecting the longitudinal conductors of FIG. 5 into the overlapping cylindrical coil groups.

Referring now to FIGS. 1 and 6, in order to reduce the capacitive coupling between the overlapping loops of the coil group 16 and 18, the conductive patterns 20 of the longitudinal segments 46 are staggered so as not to overlap. For this same reason, the circumferential segments 48, which connect the longitudinal segments 46 into the loops 22(a) through 22(d), are carried on opposite sides of annular ribs 14 and arranged on the longitudinal faces of those ribs to minimize the area over which they cross.

Placing the circumferential segments 48 on the longitudinal faces of the annular ribs 14 also reduces the longitudinal extent of each coil group 16 and 18 that would otherwise be required to minimize of crossed areas of the circumferential segments 48.

Referring again to FIG. 7(a) and (b), the circumferential coil groups 16 and 18 overlap so that their corresponding loops 22 are isolated from each other. The degree of overlap may be selected empirically and requires that a given loop 22 intercept an equal number of lines of flux 50, as might be generated from the adjacent overlapping loop 22', passing in both directions through the loop 22. Because the flux density is higher nearer to the center of overlapping loop 22', generally the overlap is much less than 50% and in fact is such as to reduce the total length of the coils by only 20% in practice.

Figure 8:
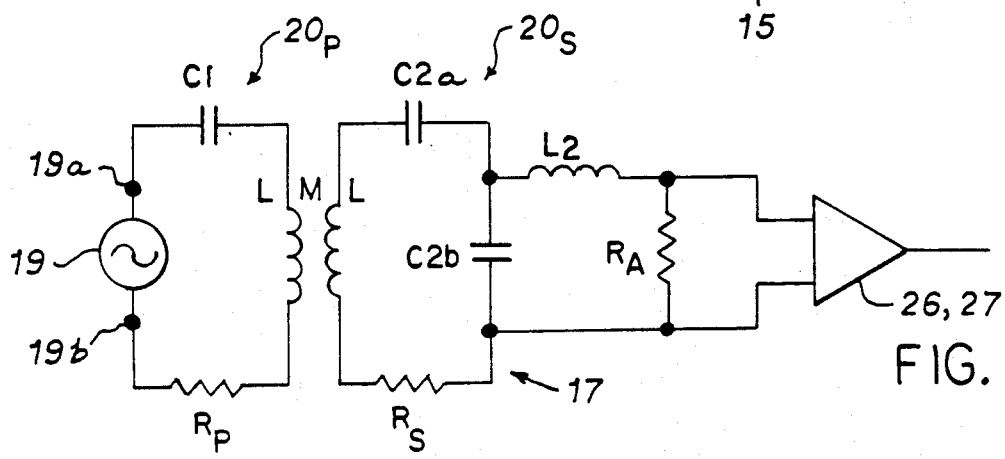
FIG. 8 is a schematic representation of two adjacent coil groups illustrating the isolation obtained by using a low input impedance preamplifier on each Helmholtz pair.

Referring now to FIG. 8, the isolation between coil groups 16 and 18 obtainable by controlling their longitudinal overlap is limited in practice and must be augmented by the use of other isolation enhancing techniques. In particular, the use of low impedance preamplifiers 26 and 27, associated with each Helmholtz coil further reduce the effective coupling between the coil groups 16 and 18.

The effect of connecting a low-input-impedance preamplifier to adjacent loops of overlapping coil groups can be analyzed by considering the two loops as being the primary winding 20p and the secondary winding 20s of a transformer 17. A coupling coefficient k exists between windings 20p and 20s. The primary and secondary windings are both considered to have the same inductance $L_1$, with a mutual coupling $M = kL_1$.

The residual resistance $R_p$ or $R_s$ of the two windings is substantially similar, so that $R_p = R_s = R_1$. If the first loop (winding 20p of inductance $L_1$, with a series capacitance $C_1$ and series resistance $R_1$) is driven by a source 19, we may remove the source and determine (a) whether the impedance seen across the source terminals 19a and 19b is substantially changed, and (b) whether additional dissipation and noise is introduced by the presence of a second surface coil (symbolized by winding 20s, resistance $R_s$ and the pair of surface coil capacitors $C_{2a}$ and $C_{2b}$). Without the second surface coil present, the impedance of the primary loop is simply $R_1 = R_p$ at the resonant frequency.

When the second surface coil is added, the impedance $Z_A$, between terminals 19a–19b, is given as $$Z_4 = R1 + \frac{\omega^2 M^2}{Z_s} \quad (2)$$

where $Z_s$ is the series impedance of the secondary surface coil loop. The secondary loop is tuned and matched to its preamplifier with multiple capacitors, which can be reduced to capacitors $C_{2a}$ and $C_{2b}$.

The residual resistance $R_s$ is converted to the source resistance $R_{opt}$ that produces the optimum noise figure performance by the preamplifier by taking:

$$\frac{1}{\omega C_{2b}} = \sqrt{R_s R_{opt}} \quad (3)$$

$L_2$ is the inductance of the coaxial cable connecting the winding 20s to the preamplifier 26 or 27 or is a discrete coil and is chosen to resonate with $C_{2b}$. $C_{2a}$ is chosen so that $L_1$ resonates with the series combination of $C_{2a}$ and $C_{2b}$. These conditions require:

$$\frac{1}{\omega C_{2b}} = \omega L_2 \text{ and } \frac{1}{\omega C_{2b}} + \frac{1}{\omega C_{2a}} = \omega L_1 \quad (4)$$

$Z_s$ is given by:

$$Z_s = R_s + j\omega L + \frac{1}{j\omega C_{2a}} + \frac{1}{j\omega C_{2b} + \frac{1}{R_4 + j\omega L_2}} \quad (5)$$

Which at resonance, reduces to:

$$Z_s = R_s[1 + R_{opt}/R_4] \quad (6)$$

where $R_4$ is the input impedance of the preamplifier 26, and may be on the order of 5Ω.

Traditional preamplifiers are designed to have $R_4 = R_{opt}$, which gives $Z_s = 2R_s$. For a low input impedance preamplifier, $R_4$ is ten to twenty times smaller than $R_{opt}$. Hence, $Z_s$ is ten or more times larger than $R_s$. Therefore, noise coupling form the secondary to the primary circuit as given by the second term on the right side of Equation (2) is reduced by a factor of five or more by using a low input impedance preamplifier.

The above description has been that of a preferred embodiment of the present invention. It will occur to those who practice the art that many modifications may be made without departing from the spirit and scope of the invention. For example, the construction of the individual coil groups need not employ Helmholtz coils but may be any conventional cylindrical coil construction that may be overlapped to form an array along a cylinder such as so-called saddle coils, fingerprint or birdcage coils. Multiple coil groups may be overlapped to achieve even longer coil structures. In order to apprise the public of the various embodiments that may fall within the scope of the invention, the following claims are made.

I claim:

1. A local volume coil for receiving NMR signals from an imaging volume, the NMR signals having a rotating transverse component about a longitudinal axis, the coil comprising:
   a tubular, generally cylindrical form having a first axis passing through the imaging volume and parallel to the longitudinal axis so as to surround the imaging volume;
   a first quadrature coil attached to the form to follow a first line of circumference of the form and so as to be sensitive to the rotating transverse component of the NMR signal along a first pair of quadrature axes from a first volume being part of the imaging volume; and
   a second quadrature coil attached to the form to follow a second line of circumference of the form, the second quadrature coil overlapping with the first quadrature coil so that the first and second quadrature coils are electromagnetically isolated from each other so that current flowing through the first quadrature coil is substantially not induced by current flowing in the second quadrature coil, wherein the second quadrature coil is sensitive to the rotating transverse component of the NMR signal along a second pair of quadrature axes from a second volume of the imaging volume displaced longitudinally from the first volume of the imaging volume.

2. The local volume coil of claim 1 wherein the first and second quadrature coils are quadrature Helmholtz coils, each having two pairs of opposed loops connected so that the signals from each opposed loop add in response to a fluctuating field along a corresponding one of the pair of quadrature axis.

3. The local coil of claim 2 wherein the loops of the two pairs of opposed loops of the quadrature Helmholtz coils are generally rectangular to have longitudinal segments parallel to the longitudinal axis and circumferential segment along a circumference of the form, wherein the longitudinal segments are spaced at 45 degrees about the longitudinal axis of the form.

4. The local coil of claim 3 wherein the form includes a set of four annular ribs extending radially outward from the longitudinal axis and positioned at the ends of the longitudinal segments and wherein the circumferential segments are carried by the annular ribs at varying distance from the longitudinal axis to minimize their capacitive coupling to other circumferential segments.

5. The local coil of claim 2 wherein each Helmholtz pair is connected to a preamplifier having an input impedance on the order of 5 ohms at a frequency of the NMR signal to minimize electrical interaction between the coils.

6. The local coil of claim 5 wherein the pairs of opposed loops of each Helmholtz coil are connected to the preamplifier across a resonating capacitor by a cable having an inductance and wherein the inductance together with the resonating capacitor form blocking circuit having a high impedance at the frequency of the NMR signal when the preamplifier terminals are shorted together during an RF excitation period.

7. A method of receiving NMR signals from an imaging volume, the NMR signals having a rotating transverse component about a longitudinal axis, the coil comprising:
   providing a tubular generally cylindrical form having a first axis passing through the imaging area and parallel to the longitudinal axis so as to surround the imaging volume;
   attaching a first quadrature coil to the form so as to follow a first line of circumference of the form and to be sensitive to the rotating transverse component of the NMR signal along a first pair of quadrature axis from a first volume being part of the imaging volume; and attaching a second quadrature coil on a second portion of the form so as to follow a second line of circumference of the form and to overlap with the first quadrature coil so that the first and second quadrature coils are electromagnetically isolated from each other so that current through the first quadrature coil is substantially not induced by current flowing in the second quadrature coil, wherein the second quadrature coil is sensitive to the rotating transverse component of the NMR signal along a second pair of quadrature axes from a second volume of the imaging volume displaced longitudinally from the first portion of the imaging volume.

8. The method of claim 7 wherein the first and second quadrature coils are quadrature Helmholtz coils each having two pairs of opposed loops, and including the step of connecting the signals from each opposed loop to add in response to a fluctuating field along a corresponding to one of the pair of quadrature axes.

9. The method of claim 8 wherein the loops of the two pairs of opposed loops of the quadrature Helmholtz coils are generally rectangular to have longitudinal segments parallel to the longitudinal axis and circumferential segment along a circumference of the form, and including the step of spacing the longitudinal segments at 45 degrees about the longitudinal axis of the form.

10. The method of claim 9 wherein the form includes a set of four annular ribs extending radially outward from the longitudinal axis and positioned at the ends of the longitudinal segments and including the step of routing the circumferential segments along the annular ribs at varying distance from the longitudinal axis to minimize their capacitive coupling to other circumferential segments.

11. The method of claim 8 including the step of connecting each Helmholtz pair to a preamplifier having an input impedance on the order of 5 ohms at a frequency of the NMR signal to minimize electrical interaction between the coils.

12. The method of claim 11 wherein the pairs of opposed loops of each Helmholtz coil are connected to the preamplifier across a resonating capacitor through an inductance and including the step of adjusting the inductance so that together with the resonating capacitor it forms a blocking circuit having a high impedance at the frequency of the NMR signal when the preamplifier terminals are shorted together during an RF excitation period.

* * * * *